US005530769A

United States Patent [19]
Saitoh

[11] Patent Number: 5,530,769
[45] Date of Patent: Jun. 25, 1996

[54] EQUALIZER AND AUDIO DEVICE USING THE SAME

[75] Inventor: Hiroyuki Saitoh, Kyoto, Japan

[73] Assignee: Rohm Co., Ltd., Kyoto, Japan

[21] Appl. No.: 321,263

[22] Filed: Oct. 11, 1994

[30] Foreign Application Priority Data

Oct. 13, 1993 [JP] Japan ................................. 5-280051

[51] Int. Cl.$^6$ ................................ H03G 5/00; H03H 5/00
[52] U.S. Cl. ........................ 381/103; 381/98; 333/28 T
[58] Field of Search ............................... 381/98, 62, 99, 381/97, 103, 101, 102; 333/28 R, 28 T

[56] References Cited

U.S. PATENT DOCUMENTS

| | | | |
|---|---|---|---|
| 4,130,727 | 12/1978 | Kates | 381/103 |
| 4,739,514 | 4/1988 | Short et al. | 333/28 T |

FOREIGN PATENT DOCUMENTS

| | | |
|---|---|---|
| 63-276312 | 11/1988 | Japan . |
| 4-51606 | 2/1992 | Japan . |

Primary Examiner—Curtis Kuntz
Assistant Examiner—Xu Mei
Attorney, Agent, or Firm—Fay, Sharpe, Beall, Fagan, Minnich & McKee

[57] ABSTRACT

An equalizer includes: a first attenuating circuit which receives an input signal and a first control signal and attenuates the input signal depending on the level of the first control signal; a filter having a predetermined frequency band which receives the output from the first attenuating circuit; an adding circuit which receives the output from the filter and the input signal so as to add the both and outputs the adjusted audio signal; a second attenuating circuit which receives the adjusted audio signal from the adding circuit and a second control signal, attenuates the adjusted audio signal depending on the level of the second control signal and sends out a phase inverted signal of the attenuated signal to the filter; wherein when a sound quality adjusting signal representing a sound quality emphasis is received, the first control signal having a level corresponding to the emphasis condition is generated and when a sound quality adjusting signal representing a sound quality attenuation is received, the second control signal having a level corresponding to the attenuation condition is generated.

9 Claims, 6 Drawing Sheets

EQUALIZER AND AUDIO DEVICE USING THE SAME

BACKGROUND OF THE INVENTION

1. Field of the Invention

The present invention relates to an equalizer and an audio device using the same and, more specifically, relates to an audio device incorporating an equalizer therein such as a graphic equalizer and a surround processor in which the S/N ratio of the incorporated equalizer is improved.

2. Description of Related Art

FIG. 6 is a diagram for explaining a cassette type tape player with an equalizer as an example of conventional audio devices, and shows an outline of a reproducing circuit for one channel. In a stereo type audio device there are provided like circuits for right and left two channels.

Numeral 1 is a read head, 2 a preamplifier, 10 an equalizer, 3 a main amplifier and 4 a speaker.

In these cassette type take players, audio signals magnetically recorded on a tape (not shown) are read via the read head 1, the read audio signals are amplified at the preamplifier 2 and the like, further the sound quality of the audio signals is adjusted by the equalizer 10, the adjusted signals are applied to the main amplifier 3 wherein the signals are power-amplified and are outputted as an audible sound from the speaker 4. Then, a listener can vary the sound quality by manipulating a variable resistor 12 while listening so as to meet his or her tast.

Between a non-inverted input terminal constituting (+) side phase input (hereinbelow simply called as (+) input) and an inverted input terminal constituting (−) side (hereinbelow simply called as (−) input) of an operational amplifier 11 in the equalizer 10, a variable resistor (VR) 12 having resistance R1 is connected, and the movable terminal of the variable resistor 12 is grounded via LCr series resonant circuit 13. The output signal (voltage signal) Vo of the operational amplifier 11 is fed back to the (−) input via a resistor Ro, and an input signal (voltage signal) Vi is applied to the (+) input via a resistor Ri.

Now, when assuming that an open loop gain of the operation amplifier 11 is GA, and further assuming as GA>>1 and resistance values of the resistors Ri and Ro as Ri=Ro=R, the following relations stand. Wherein Ri and Ro are respectively resistance values of the resistors Ri and Ro, and the both terminals of the variable resistor 12 are designated as point A and point B as illustrated.

(1) When the movable terminal of the variable resistor 12 is at point A, the input and output relationship at the resonant frequency fo of the series resonant circuit 13 is expressed as follows. Wherein since the (+) input and the (−) input are virtually short-circuited, no current follows through the variable resistor 12, thus the operational amplifier 11 works as a buffer amplifier;

$$Vo = \frac{r}{Ri+r} Vi = \frac{r}{R+r} Vi$$

wherein r represents resistance value of the resistor r in the series resonant circuit 13. From the above equation it is understood that the output signal attenuates with respect to the input signal.

(2) When the movable terminal of the variable resistor 12 is at point B, the input and output relationship at the resonant frequency f0 of the series resonant circuit 13 is expressed as follows. Wherein at this moment too no current flows through the variable resistor 12. For this reason the operational amplifier 11 operates as an ordinary amplifier circuit.

$$Vo = \frac{Ro+r}{r} Vi = \frac{R+r}{r} Vi$$

From the above equation it is understood that the output signal is emphasized with respected the input signal.

(3) When the movable terminal of the variable resistor 12 is at the center thereof, the input and output relationship at the resonant frequency fo of the series resonant circuit 13 is expressed as;

$$Vo = Vi$$

Since Ri=Ro=R, the voltage ratio with respect to the input voltage applied to (+) input and the amplification rate of the operational amplifier 11 are equalized and a same input voltage V1 is generated at (+) input and (−) input.

According to the above equations, it is understood that the circuit explained shows the function of an equalizer having a resonant frequency at the center thereof.

Although in the above explanation a circuit having one series resonant circuit 13 is exemplified, such as CD radio and cassette recorders and component stereo devices comprise a plurality of graphic equalizer circuits each of which covers a predetermined audible subband determined by dividing an audible band into about 5~7 subbands. The respective resonant circuits perform a filtering operation for effecting an attenuation or an emphasis on their input signals over a predetermined subband having a predetermined center frequency.

In the circuit of this type, 5~7 pieces of such series resonant circuits 13 and variable resistors 12 are respectively connected in parallel between (+) input and (−) input of the operational amplifier 11.

Therefore many number of variable resistors 12 are connected at the input side of the operational amplifier. Since these variable resistors 12 are positioned at the operation panel and are manipulated there, long leading wires thereto are necessitated. Further, since audio signals flow these variable resistors 12, there is a drawback that the equalizer of this type is likely to be affected by noises because of these wirings.

JP-A-63-276312(1988) is exemplified as disclosing a circuit which improves the above drawback. In the improved circuit no variable resistors 12 are provided at the input side of the operational amplifier 11 as illustrated in FIG. 7. Instead, voltage-current converting circuits (hereinbelow simply called as V/I converting circuit) 30 and 31 are provided at the input side of the operational amplifier 11 and the current flowing through these circuits are controlled by their respective variable resistors 12 (not shown). With this measure the variable resistors 12 which adjust the sound quality are isolated from the audio signals and thereby noises are reduced.

The V/I converting circuits 30 and 31 receive input signals via an active filter 32 and convert voltage signals in a predetermined frequency band into current values. The current values converted here are respectively applied to (+) input and (−) input of the operation amplifier 11 through which an attenuated or an emphasized signal with respect to the signals in the predetermined frequency band extracted by the active filter 32 is obtained. Further, the V/I converting circuits 30 and 31 are constituted so as to perform a differential operation each other in response to an operation of a circuit including the variable resistors 12.

With this circuit structure, the noises due to leading wires between the variable resistors and the operational amplifier are reduced and the S/N ratio thereof is improved in comparison with the circuit as illustrated in FIG. 6. However, the present circuit necessitates a resistor Ri connected in series with the input and further the resistance value thereof has to be set substantially the same as that of the feed back resistor Ro in the operational amplifier 11. For this reason the freedom of the circuit designing is restricted as well as the level of the input voltage Vi is also limited. As a result, a sufficient dynamic range can not sometimes be used depending on a bias voltage for an input signal and the S/N ratio is not necessary sufficient.

For overcoming the above problems the applicant proposed a circuit in a JP-A-4-51606 which is hardly limited by a bias for the input signal, can select a large dynamic range and shows a desirable S/N ratio, as illustrated in FIG. 8.

The circuit in FIG. 8 comprises a V/I converting circuit 37 which receives input signals Vi, an active filter 33 which receives the output of the V/I converting circuit 37, an operational amplifier 11, a load resistor RL, another V/I converting circuit 34a and a further V/I converting circuit 35a, and the variable resistor 12 is completely isolated from the V/I converting circuits 34a and 35a via a control circuit 36.

In the circuit, the load resistor RL receives the output of the V/I converting circuit 37. The (+) input of the operational amplifier 11 receives the voltage VL generated at the load resistor RL and the output side of the operation amplifier 11 is fed back via a feed back resistor Ro to the (−) input thereof.

The V/I converting circuit 34a receives the output from the active filter 33, the output side thereof is connected to the (+) input of the operational amplifier 11, in other words the voltage generating side of the load resistor RL and the gain thereof is controlled depending on the current value of a variable current source 34b.

The V/I converting circuit 35a receives the output of the active filter 33, the output thereof is connected to the (−) input of the operational amplifier 11 and the gain thereof is controlled depending on the current value from a variable current source 35b. Further, the current values from the respective variable current sources 34b and 35b for the V/I converting circuit 34a and the V/I converting circuit 35a are controlled by a DC signals from the control circuit 36.

Thus, through provision of the V/I converting circuit 37 receiving the input signal Vi at the input side of the operational amplifier 11 a current corresponding to the voltage level of the input signal Vi is flowed through the load resistor RL to generate a voltage VL. Then the voltage VL is designed to be applied to the operational amplifier 11. Further, in order to attenuate or emphasize signals in predetermined frequency bands among many input signals, the current from the V/I converting circuit 37 is received by the active filter 33 to generate voltage signals corresponding to the predetermined frequency bands and the generated voltage signals are converted by the V/I converting circuits 34a and 35a provided respectively for attenuation and for emphasis. Further, the converted current output from the V/I converting circuit 34a is applied to the load resistor RL to generate a voltage signal and to add here to the input signal Vi. Still further, the output of the V/I converting circuit 35a is applied to the (−) input of the operational amplifier 11 to subtract the same from the input signal. With thus constituting the circuit the insertion of the resistor Ri in series with the input side of the operational amplifier 11 is eliminated.

Since the V/I converting circuits are introduced at the input side of the operational amplifier and a resistor is inserted in parallel with the input of an amplifier circuit such as an operational amplifier, a freedom for setting an input bias is produced as well as a sufficient dynamic range is obtained. Still further, the circuit is not controlled directly by a variable resistor circuit but by a DC signal, a large S/N ratio can be achieved.

The conventional audio device as explained above constitutes such an equalizer in which predetermined frequency bands in the audio signals are extracted via respective filters, each of the extracted frequency bands is divided into two series, one for attenuation and the other for emphasis, and signals of which predetermined frequency bands are attenuated or emphasized are generated and then these attenuated or emphasized signals are added or subtracted to and from the original audio signals. Accordingly, the sound quality thereof is improved in comparison with the other conventional devices, however a further S/N ratio improvement is still required from users using the above audio devices.

SUMMARY OF THE INVENTION

An object of the present invention is to fulfill the above requirement and is to provide an equalizer showing a desired S/N ratio.

Another object of the present invention is to provide an audio device showing a desired S/N ratio which permits sound quality adjustment.

In an equalizer which receives an audio signal as an input signal, produces a signal having a predetermined frequency band among the input signal and adds or subtracts the produced signal having a predetermined frequency band to and from the audio signal so as to generate an audio signal adjusted either into an attenuated sound quality or an emphasized sound quality, the feature of the equalizer according to the present invention which achieves the above objects comprises a first attenuating circuit which receives the input signal and a first control signal and attenuates the input signal depending on the level of the first control signal; a filter having the predetermined frequency band which receives the output from the first attenuating circuit; an adding circuit which receives the output from the filter and the input signal so as to add the both and outputs the adjusted audio signal; a second attenuating circuit which receives either the adjusted audio signal from the adding circuit or a signal corresponding thereto and a second control signal, attenuates either the adjusted audio signal or the signal corresponding thereto depending on the level of the second control signal and sends out a phase inverted signal of the attenuated signal to the filter, wherein when a sound quality adjusting signal representing a sound quality emphasis the first control signal having a level corresponding to the emphasis condition is generated and when a sound quality adjusting signal representing a sound quality attenuation the second control signal having a level corresponding to the attenuation condition is generated.

Since the filter is disposed downstream of the attenuating circuits, the input signal is for the first time attenuated by the attenuating circuits then a signal having a predetermined frequency band is extracted through the filter. Accordingly, noises generated in the attenuating circuits are also processed through the filter, frequency components other than the predetermined frequency band of the noises generated in the attenuating circuits are cut off by the filter. Thereby the noise components corresponding to the cut off portions contained in the signal for the sound quality adjustment are further reduced in comparison with the above explained conventional device.

Further, the input signals for the first attenuating circuit and the second attenuating circuit are respectively independent and are not affected each other, and still further, under an attenuating condition which reduces a sound quality a feed back loop is established, thereby the noises of the equalizer is further reduced.

Accordingly, for the sound quality adjusted audio signals the S/N ratio is improved in comparison with one in the conventional device. Further, when the operation of the first and second attenuating circuits is interrupted under the sound quality non-adjusted condition, the original audio signals are cut off from the signals processed by the equalizer to thereby improve a sound quality.

DESCRIPTION OF THE PREFERRED EMBODIMENTS

Figure 1:
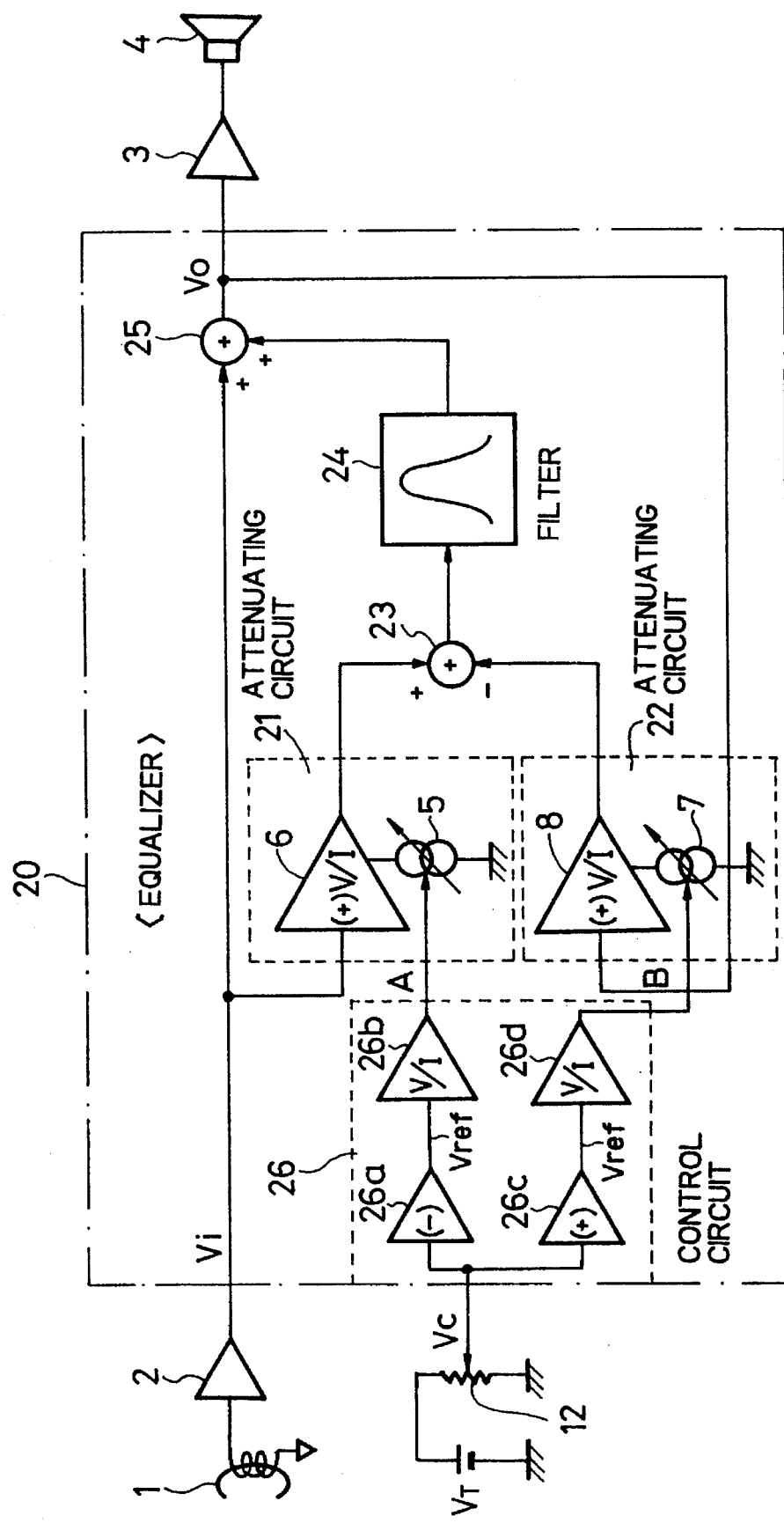
FIG. 1 is a block diagram of one embodiment of cassette type tape players including an equalizer according to the present invention.
Figure 6:
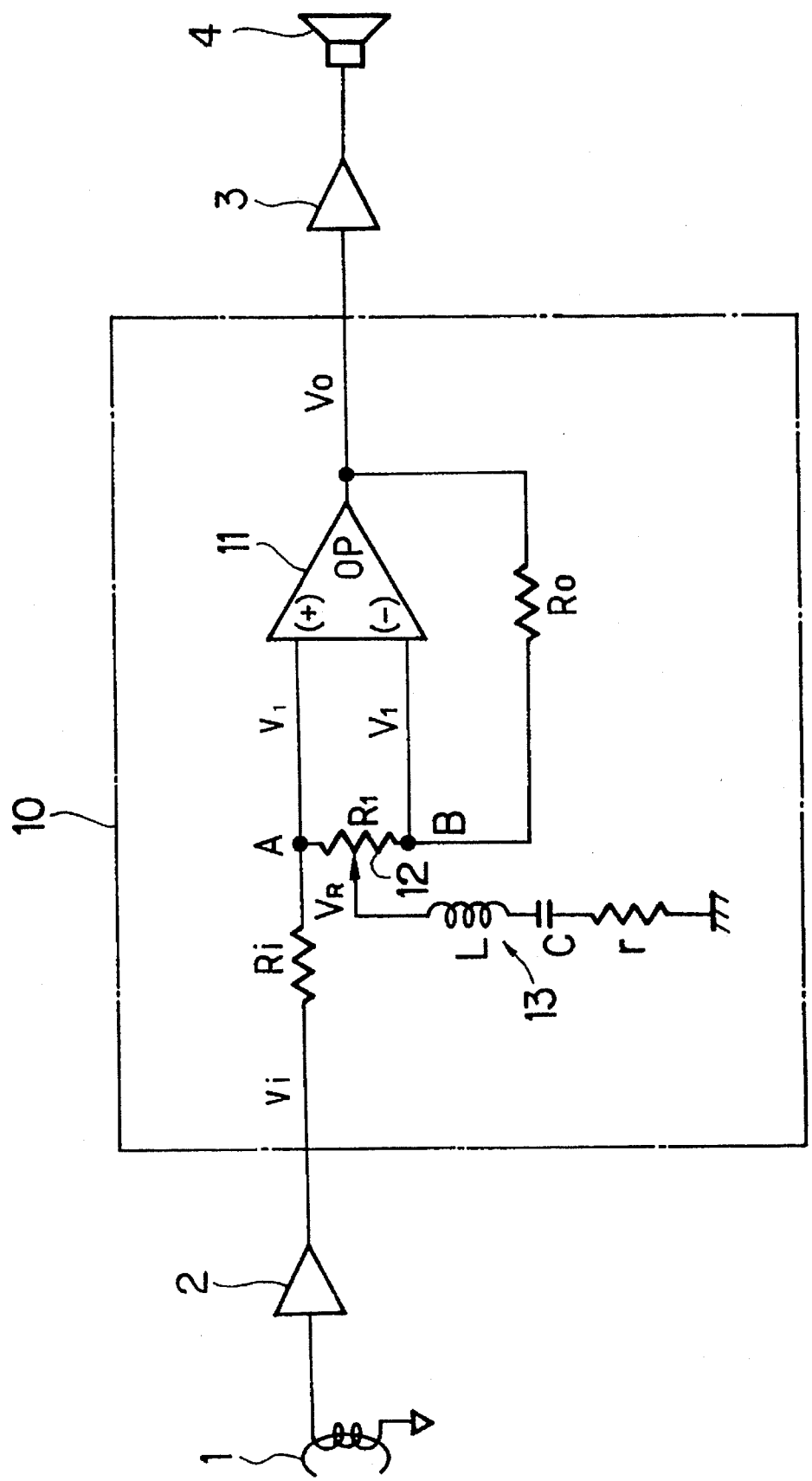
FIG. 6 is a schematic diagram of a conventional cassette type tape player.
Figure 7:
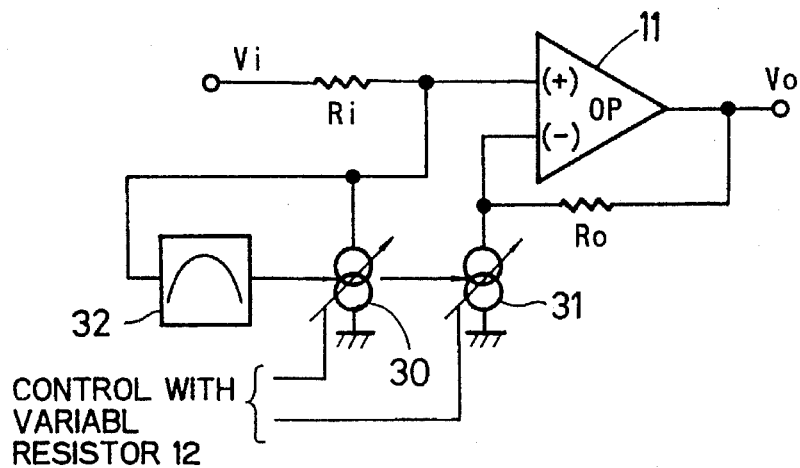
FIG. 7 is a circuit diagram of an example of conventional graphic equalizers.

FIG. 1 shows an outline of a reproducing circuit for one channel portion in the like cassette type tape player as in FIG. 6. In a stereo type audio device there are provided the same circuits for right and left two channels. Further, the same constitutional elements in FIG. 1 as in FIG. 6 are designated by the same reference numerals and the explanations thereof are omitted.

A difference of FIG. 1 circuit from FIG. 6 circuit is that an equalizer 20 is provided in place of the equalizer 10.

The equalizer 20 is composed by an attenuating circuit 21, another attenuating circuit 22, an adder circuit 23, a filter 24, another adder circuit 25 and a control circuit 26.

The control circuit 26 receives a sound quality adjusting signal from a variable resistor 12 disposed at an operational panel side and sends out control current signals A and B (hereinafter simply called as control signals A and B) respectively to the attenuating circuits 22 and 21 depending on the voltage levels of the sound quality adjusting signals. These control signals are DC signals showing a high resistance to noises. The details of the control signals will be explained later.

The attenuating circuit 21 is inputted of an audio signal Vi, attenuates the inputted signal at a converting rate depending on the current level of the control signal A and outputs the attenuated input signal. The output from the attenuating circuit 21 is applied to the (+) input of the adder circuit 23. As a result, the phase of the output from the adder circuit 23 is matched with that of the original audio signal Vi and the output constitutes an adding signal with respect to the original audio signal which is added later to the original audio signal Vi. In this arrangement, the passage through the attenuating circuit 21 constitutes an emphasizing line.

The attenuating circuit 22 is inputted of an audio signal Vo, attenuates the inputted signal at a converting rate depending on the current level of the control signal B and outputs the attenuated input signal. The output from the attenuating circuit 22 is applied to the (−) input of the adder circuit 23. As a result, the phase of the output of the adder circuit 23 is inverted with respect to the original audio signal Vi and the output constitutes an subtracting signal with respect to the original audio signal which is added later to the original audio signal Vi. In this arrangement, the passage through the attenuating circuit 22 constitutes an attenuating line.

The attenuating circuit 21 is constituted by a variable current source 5 of which current value is controlled depending on the value of the control signal A and a V/I converting circuit 6 including the variable current source 5 and performing an attenuating operation (a gain γ in connection with the input and output relationship), and the attenuating circuit 22 is constituted by a variable current source 7 of which current value is controlled depending on the value of the control signal B and a V/I converting circuit 8 including the variable current source 7 and performing an attenuating operation. The V/I converting circuits 6 and 8 decrease the V/I converted output current depending on the current increase from the variable current sources of which constitution is similar to that of FIG. 8 including the V/I constituting circuit 34a and the variable current source 34b, however of which control operation is different from that of FIG. 8. A V/I converting circuit ordinarily increases a converted current depending on a current increase of the current source, accordingly for an attenuating operation the converted current is decreased depending on a current decrease. Contrary thereto, the attenuating circuits 21 and 22 perform an opposite operation of which reason will be explained later.

In the present embodiment, the filter 24 is disposed downstream the adder circuit 23 and is designed to receive the output of the adder circuit 23. As a result, from the filter 24 only frequency components in a predetermined frequency band determined by the filter characteristic are outputted among the output signal components from the adder circuit 23 and the frequency components out of the predetermined frequency band are cut off. Accordingly, with the above arrangement noises are reduced in comparison with the conventional devices, and the same is true with noises superposed on the output from the attenuating circuit 22.

The output from the filter 24 is applied to the (+) input of the adder circuit 25, and to the other (+) input of the adder circuit 25 the audio signal Vi is applied. The addition result of the above two signals in the adder circuit 25 is outputted as the audio signal Vo.

The control circuit 26 comprises a control signal A generating circuit incorporating therein an inverting amplifier 26a and a V/I converting circuit 26b and a control signal B generating circuit incorporating therein a non-inverting amplifier 26c and a V/I converting circuit 26a, and the inverting amplifier 26a and the non-inverting amplifier 26c respectively receive a voltage value of a sound quality adjusting signal from the variable resistor 12.

At first, when the setting of the variable resistor 12 is at the center thereof, namely under the sound quality non-adjusting condition, the current values of the control signals A and B are set at respective predetermined values and the current values of the respective variable current sources 5 and 7 are also at a predetermined value I or more than that value so as to increase the attenuation amount of the attenuating circuits 21 and 22 to ∞, thereby the respective outputs of the attenuating circuits 21 and 22 are interrupted. As a result, the outputs of the adder circuit 23 and the filter 24 are rendered to "0".

Now, when assuming that the voltage at the center point of the variable resistor 12 is Vc, the inverting amplifier 26a and the non-inverting amplifier 26c in the control circuit 26 receive the center point voltage Vc and respectively generate a voltage Vref. The V/I converting circuit 26b and the V/I converting circuit 26d respectively convert the voltage Vref into a current value. With the converted current signal the current of the variable current sources 5 and 7 is set at the predetermined value I or more than that value.

Under an attenuating adjusting condition when the setting of the variable resistor 12 is manipulated downward from the center point, the voltage generated by the variable resistor 12 is less than Vc. At this instance, the current value of the control signal A is set at the predetermined value or more than that value and the current level of the control signal B is increased depending on the downward manipulation amount of the setting from the center point of the variable resistor 12.

Namely, when the voltage of the variable resistor 12 reduces below Vc, of which the inverting amplifier 26a in the control circuit 26 receives and renders its output voltage more than the voltage Vref and the output voltage is converted into a current value by the V/I converting circuit 26b. Thereby, the current of the variable current source 5 is set at more than the predetermined value I. On one hand, when the voltage of the variable resistor 12 reduces below Vc, of which the non-inverting amplifier 26c receives and renders its output voltage less than the voltage Vref and the output voltage is converted into a current value by the V/I converting circuit 26d. Thereby the current of the variable current source 7 is set at less than the predetermined value I.

As a result, the attenuation amount of the attenuating circuit 22 reduces to thereby increase its output. The output thereof operates as a subtracting amount with respect to the original audio signal such that the output Vo is attenuated. In this instance, since the output voltage of the variable resistor 12 reduces depending on the manipulated amount, the sound quality adjusted audio signal attenuates depending on the manipulation amount. Further, in this instance the operation of the attenuating circuit 21 is interrupted by the current of the variable current source 5.

As an alternative, a circuit can be added which clamps the output of the inverting amplifier 26a at Vref when the output voltage of the variable resistor 12 reduces below Vc and with such measure the current value of the current source 5 is fixed at the predetermined value I in the above instance.

Under the emphasized adjusting condition when the setting of the variable resistor 12 is manipulated upward from the center point, the voltage generated at the variable resistor 12 exceeds Vc. At this instance, the current value of the control signal B is set at the predetermined value or more than that value and the current level of the control signal A is increased depending on the upward manipulation amount from the center point of the variable resistor 12.

Namely, when the output voltage of the variable resistor 12 exceeds Vc, of which the inverting amplifier 26a in the control circuit 26 receives and renders its output voltage less than the voltage Vref, and the output voltage is converted into a current value by the V/I converting circuit 26b. Thereby, the current of the variable current source 5 reduces below the predetermined value I. On one hand, when the output voltage of the variable resistor 12 exceeds Vc, of which the non-inverting amplifier 26c in the control circuit 26 receives and renders its output voltage more than the voltage Vref and the output voltage is converted into a current value by the V/I converting circuit 26d. Thereby, the current of the variable current source 7 is set at more than the predetermined value I.

As a result, the attenuation amount of the attenuating circuit 21 reduces to thereby increase its output. The output thereof operates as an adding amount with respect to the original audio signal such that the output Vo increases. In this instance, since the output voltage of the variable resistor 12 increases depending on the manipulation amount, the sound quality adjusted audio signal is emphasized depending on the manipulation amount. Further, in this instance the operation of the attenuating circuit 22 is interrupted by the current of the variable current source 7.

Further, like the above alternative, a circuit can be added which clamps the output of the non-inverting amplifier 26c at Vref when the output voltage of the variable resistor 12 exceeds Vc and with such measure the current value of the variable current source 7 is fixed at the predetermined current value I like the above arrangement.

As a result of the above constitution, a sound quality adjustment covering attenuation adjustment, no adjustment and emphasis adjustment can be performed by the variable resistor 12 through the similar manipulation as in the conventional one.

Now, a relationship between the operation of thus constituted equalizer 20 and noises is explained.

When the equalizer 20 is under the sound quality non-adjusting condition through the variable resistor 12, since the output level of the filter 24 is "0", the audio signal Vi is shifted into the audio signal Vo as it is without being subjected to an adjustment. Accordingly, noises affected by the equalizer is excluded and a signal of a high sound quality is outputted.

Figure 8:
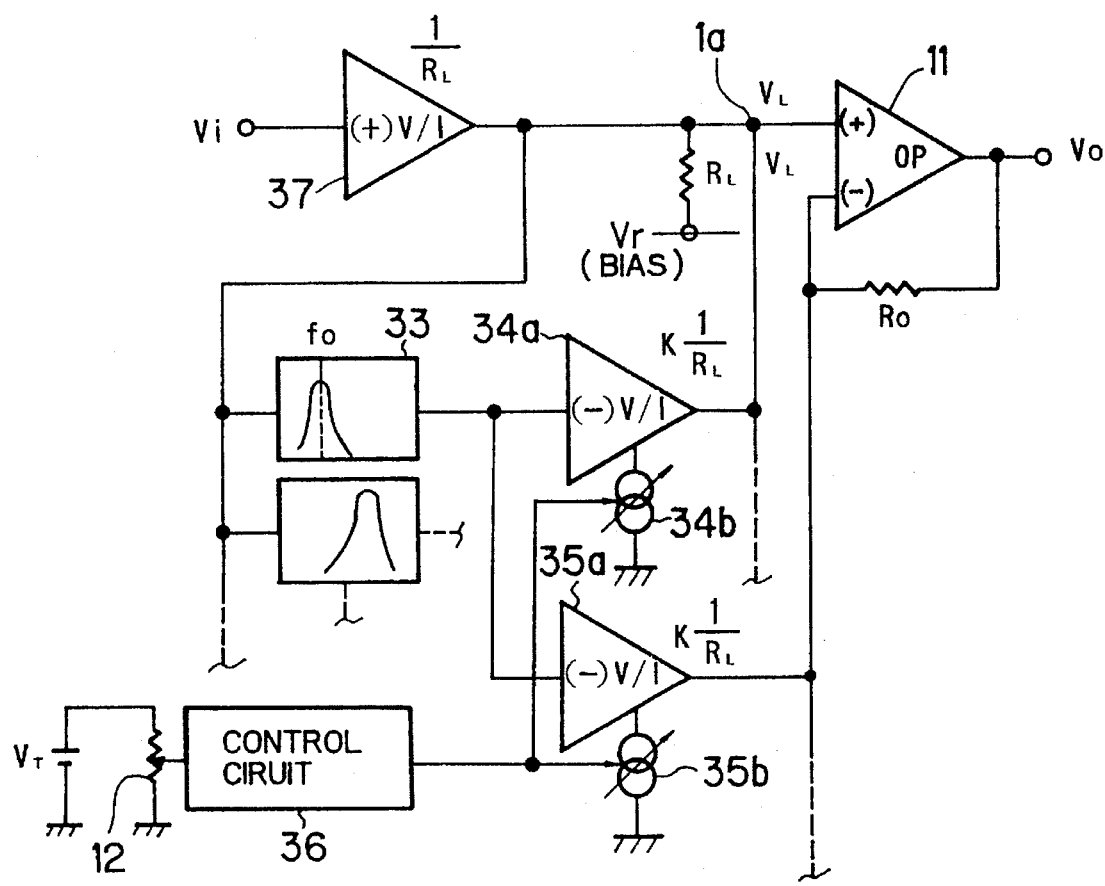
FIG. 8 is a circuit diagram of a graphic equalizer disclosed in a prior Japanese patent application of the present applicant.

Subsequently, when the equalizer 20 is under the sound quality attenuating condition, the attenuating circuit 21 is interrupted and only the attenuating circuit 22 is operated. The audio signal Vo is returned to the input of the attenuating circuit 22 and the attenuated signal is phase-inverted at the adder circuit 23 and is added to the filter 24. Then only the phase-inverted signal in a predetermined frequency band is added to the original audio signal Vi via the filter 24. As a result, the level of the audio signal Vi reduces and attenuates depending on the output level of the filter 24. Further, in the present circuit an attenuation adjustment is effected by the feed back loop, the influence by noises is further reduced in comparison with one in the circuit as shown in FIG. 8.

When the equalizer 20 is under the sound quality emphasizing condition, the attenuating circuit 22 is interrupted and only the attenuating circuit 21 is operated. The attenuated signal is applied in inphase to the adder circuit 23 and added to the filter 24. Then only the inphase signal in a predetermined frequency band is added to the original audio signal Vi. As a result, the level of the audio signal Vi increases and is emphasized depending on the output level of the filter 24.

In the above arrangement, the signal input sides of the circuit for emphasizing and the circuit for the attenuating are independently constituted and the both circuits are independently operated, the circuits are hardly affected by noises.

As an alternative, when the V/I converting circuits 6 and 8 are constituted in such a manner that the converted current increases depending on the current increase of the current sources, such control has to be used in which under the sound quality non-adjusting condition the current of the current sources 5 and 7 is set at "0" and the current increases depending on the manipulation amount of the variable resistor 12. Although such control is indeed possible, however even if the current of the current source is set at "0", there can exist some leakage and it is difficult to completely interrupt the operation of the attenuating circuits 21 and 22. Accordingly in view of the noises reduction, it is further preferable to use the above explained control.

Figure 4:
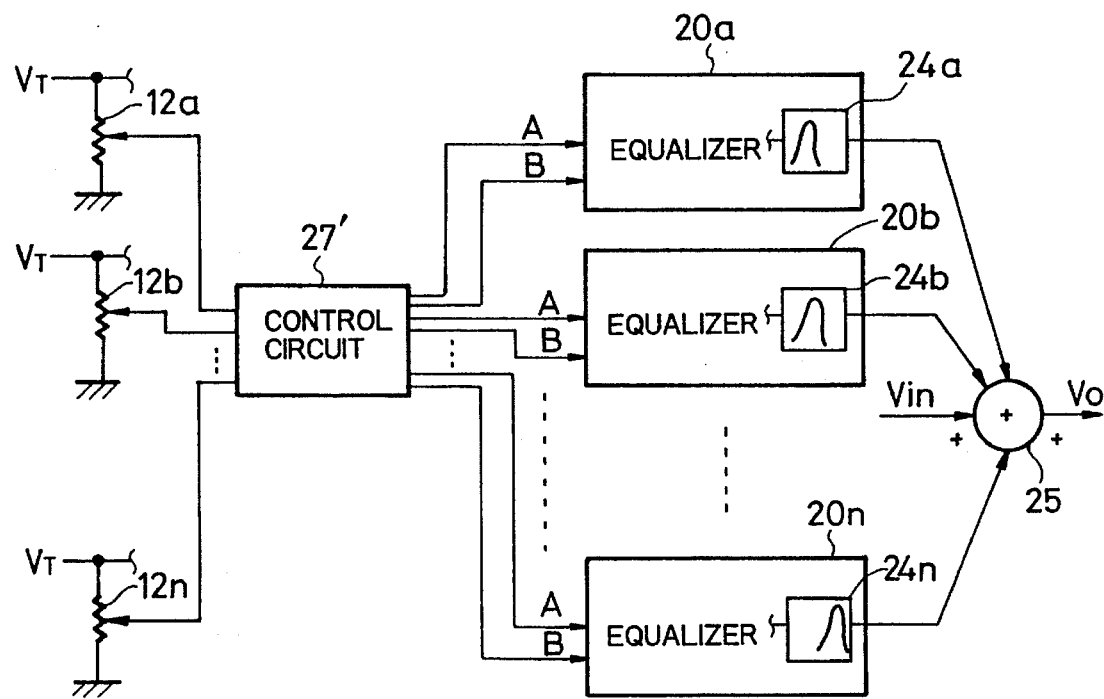
FIG. 4 is a diagram for explaining an instance wherein an equalizer according to the present invention is applied to a graphic equalizer having a multiplicity of such equalizers.

FIG. 1 shows a circuit in which one frequency band for audio signal in only one channel is adjusted. The circuit shown in FIG. 1 is a basic minimum constitution. In CD radio and cassette type recorders, component stereotype devices and the like an audible band is divided into 5–7 subbands for which respective equalizer circuits are assigned as explained previously. Accordingly, a provision in which a plurality of circuits corresponding to the divided number and comprising such as the attenuating circuits 22 and 21, the control circuit 26, the adder circuit 23 as shown in FIG. 1 are connected in parallel can be used as a graphic equalizer for many kinds of audio devices. FIG. 4 shows an example of such graphic equalizers and a control circuit 27' therefor. The respective equalizers 20a, 20b, . . . 20n correspond to an equalizer circuit excluding the adder circuit 25 and the control circuit 26 from the equalizer 20 shown in FIG. 1, and apart from the filter 24 the center frequencies for the respective filters 24a, 24b, 24n are differentiated so as to correspond to respective covering sound quality adjusting signals.

The control circuit 26 is replaced by the control circuit 27' and the control circuit 27' receives respective sound quality adjusting signals from variable resistors 12a, 12b, . . . 12n each assigned to the respective equalizers 20a, 20b, . . . 20n and generates respective equalizer control signals A and B to a corresponding equalizer having a filter covering one of the respective sound quality adjusting signals.

Figure 2:
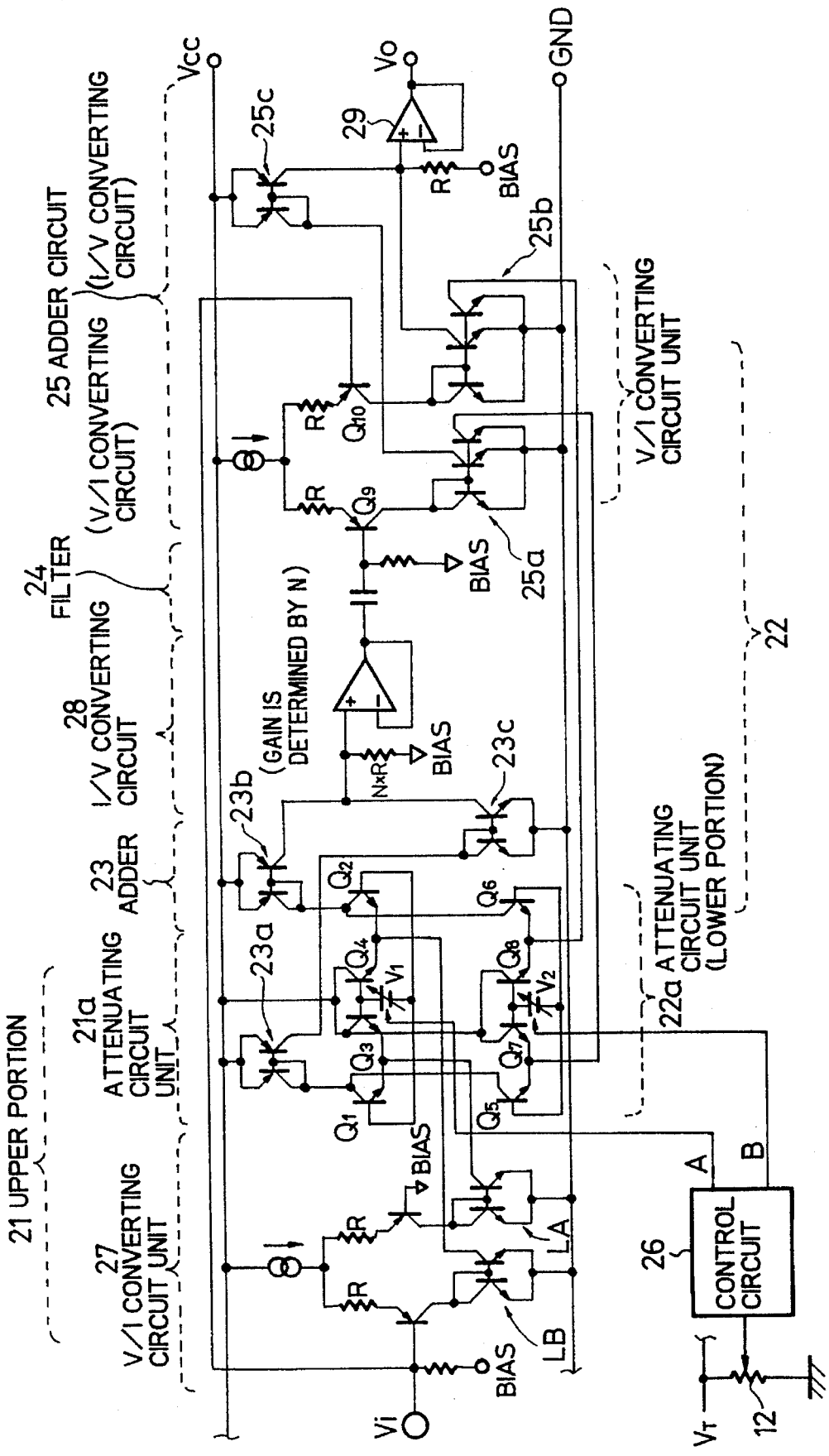
FIG. 2 is a detailed circuit diagram of the above equalizer.

FIG. 2 shows a practical circuit for the equalizer 20. The circuit shown is fundamentally the same as that shown in FIG. 1. In the circuit shown in FIG. 2, the attenuating circuit 21 as shown in FIG. 1 which receives the audio signal Vi is constituted by a V/I converting circuit unit 27 and an attenuating circuit 21a and of which V/I converting portion is constituted by the V/I converting circuit unit 27, active loads LA and LB thereof and transistors Q1 and Q2 in the attenuating circuit unit 21a which receive outputs from these loads. The variable current source is constituted by a transistor Q3 of which emitter is connected to the emitter of the transistor Q1, a transistor Q4 of which emitter is connected to the emitter of the transistor Q2 and a variable voltage circuit V1.

In the variable current source, the base voltages of the transistors Q3 and Q4 are controlled via the variable voltage circuit V1 by the control circuit 26 and thereby the collector currents of the transistors Q1 and Q2 are controlled. The collector currents of the transistors Q1 and Q2 represent the converting current value and are applied to current miller circuits 23a and 23b.

In the present embodiment, the input signal Vi is converted into two different current values of which phases deviate by 180° each other by the active loads LA and LB of the V/I converting circuit unit 27. These two currents are respectively applied to the emitters of the transistors Q1 and Q2 and the remaining currents obtained by subtracting the current values via the transistors Q3 and Q4 from these emitter currents are produced as the collector outputs of the transistors Q1 and Q2.

In the like manner, transistors Q9 and Q10 and current miller circuits 25a and 25b provided in the adder circuit 25 constitutes the V/I converting circuit unit for the output Vo in which two different currents of which phases are inverted with respect to the output Vo and deviated by 180° each other are produced and the these currents are applied to the emitters of transistors Q5 and Q6 in the attenuating circuit unit 22a as the input signals, in which the V/I converting portion is constituted by the transistors Q9 and Q10, current miller circuits 25a and 25b and the transistors Q5 and Q6. The variable current source is constituted by a transistor Q7 of which emitter is connected to the emitter of the transistor Q5, a transistor Q8 of which emitter is connected to the emitter of the transistor Q6 and a variable voltage circuit V2.

Except that the input signal is the signal at the output side the constitution and the operation of the present arrangement are substantially the same as the previously explained arrangement, in that, the transistors Q5, Q6, Q7 and Q8 correspond to the transistors Q1, Q2, Q3 and Q4, the variable voltage circuit V2 corresponds to the variable voltage circuit V1 and the attenuating circuit 22a corresponds to the attenuating circuit 21a therefore the detailed explanation of the present arrangement is omitted.

Further, the variable voltage circuits V1 and V2 can be constituted by an I/V converting circuit which converts the current values of the control signals A and B into voltage values.

The adder circuit 23 takes out the respective collector outputs of the transistors Q1, Q2, Q5 and Q6 as outputs having inverted phases each other via the current miller circuits 23a and 23b, and from a current miller circuit 23c an added output thereof is taken out. At this moment, since the output of the transistors Q5 and Q6 deviate by 180° in phase with respect to the input signal Vi, the outputs effect as subtraction with regard to the input signal Vi. At the upstream of the filter 24 which receives the output from the adder circuit 23 a current-voltage converting circuit (I/V converting circuit) 28 is provided. Further, at the input side of the adder circuit 25 which receives the output of the filter 24 a V/I converting circuit is provided. The filter 24 can be an active filter, however in the present embodiment the filter 24 is a non-active filter. For this reason the current signal is converted into a voltage signal through the I/V converting circuit 28 and the converted signal is applied to the CR filter and then through the provision of the V/I converting circuit at the input side of the adder circuit 25 the voltage signal obtained from the CR filter is again converted into a current signal.

The adder circuit 25 receives the output from the filter 24 via the transistor Q9 which includes the current miller circuit 25a as a load and further receives the input signal Vi via the transistor Q10 which includes the current miller circuit 25b as a load. Then an output formed by adding these input signals is sent out from the current miller circuit 25a to the current miller circuit 25c and is further converted into a voltage value via a load resistor R. Then the converted voltage value is applied to a buffer amplifier 29 and the output voltage Vo is obtained at the output of the buffer amplifier 29.

In the present embodiment, since the adder circuit 25 produces the current signal which is sent out as the output signal to the attenuating circuit 22a, the I/V converting circuit including the current miller circuit 25c, the load resistor R and the buffer amplifier 29 is provided at the upstream of the main amplifier 3.

Further, the current signal fed back to the input of the attenuating circuit 22 is one converted into a current value of the audio signal Vo and is an equivalent signal of the audio signal Vo. Still further, in the present embodiment the attenuating circuit is realized by the V/I converting circuit constituted by the attenuating circuit unit including the current source and the V/I converting circuit unit.

Now, when the setting of the variable resistor 12 is at the center position thereof, in that under the sound quality non-adjusting condition, the control circuit 26 generates the control signal A having a current value which sets the voltage of the variable voltage circuits V1 and V2 at a predetermined high voltage level so as to hold the off condition of the transistors Q1, Q2, Q5 and Q6. The current flows into the loads LA and LB at this moment comes from the transistors Q2 and Q4 in the current source, thus the output of the attenuating circuit 21 is halted. In the like manner, the current flows into the current miller circuits 25a and 25b at this moment comes from the transistors Q7 and Q8 in the current source, thus the output of the attenuating circuit 22 is halted.

When the setting of the variable resistor 12 is manipulated upward from the center position thereof, the control circuit 26 receives a higher voltage value than one at the center position and applies a control signal A having a current value to the variable voltage circuit V1 which sets a voltage level depending on the manipulation amount but below the predetermined voltage level. In response to the control signal A the collector current of the transistors Q1 and Q2 increases and the output of the attenuating circuit 21 begins to increase. At this amount, a control signal B having a current value is generated which sets the voltage level above the predetermined voltage level which holds the transistors Q5 and Q6 in off condition.

On the other hand, when the setting of the variable resistor 12 is manipulated downward from the center position thereof, the control circuit 26 receives a lower voltage value than one at the center position and applies a control signal B having a current value to the variable voltage circuit V2 which sets a voltage level depending on the manipulation amount but below the predetermined voltage level. In response to the control signal the collector current of the transistors Q5 and Q6 increases and the output of the attenuating circuit 22 begins to increase. At this moment, a control signal A having a current value is generated which sets the voltage level above the predetermined voltage level which holds the transistors Q1 and Q2 in off condition. Through the thus explained operation the control from attenuation to emphasis is performed in response to the manipulation of the variable resistor 12.

Figure 5:
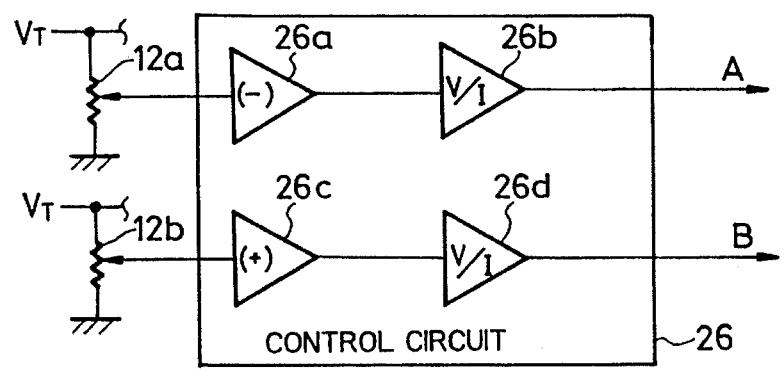
FIG. 5 is a diagram for explaining an instance wherein a variable resistor for sound quality emphasis and a variable resistor for sound quality attenuation are independently provided.

In the above embodiments, a single variable resistor 12 is provided and the center position thereof is determined to represent a sound quality non-adjusting condition, and when the setting is manipulated upward the sound quality is emphasized and when the setting is manipulated downward the sound quality is attenuated, however a variable resistor for setting a sound quality emphasizing condition and another variable resistor for setting a sound quality attenuating condition can be provided separately which apply their respective output voltages to the control circuit 26. FIG. 5 shows such an example, in which the voltage signal from a variable resistor 12a constitutes an input signal to an inverting amplifier 26a and voltage signal from a variable resistor 12b constitutes an input signal to a non-inverting amplifier 26c, but the control signals A and B generated by the control circuit 26 are identical as those in the previous embodiments.

Figure 3:
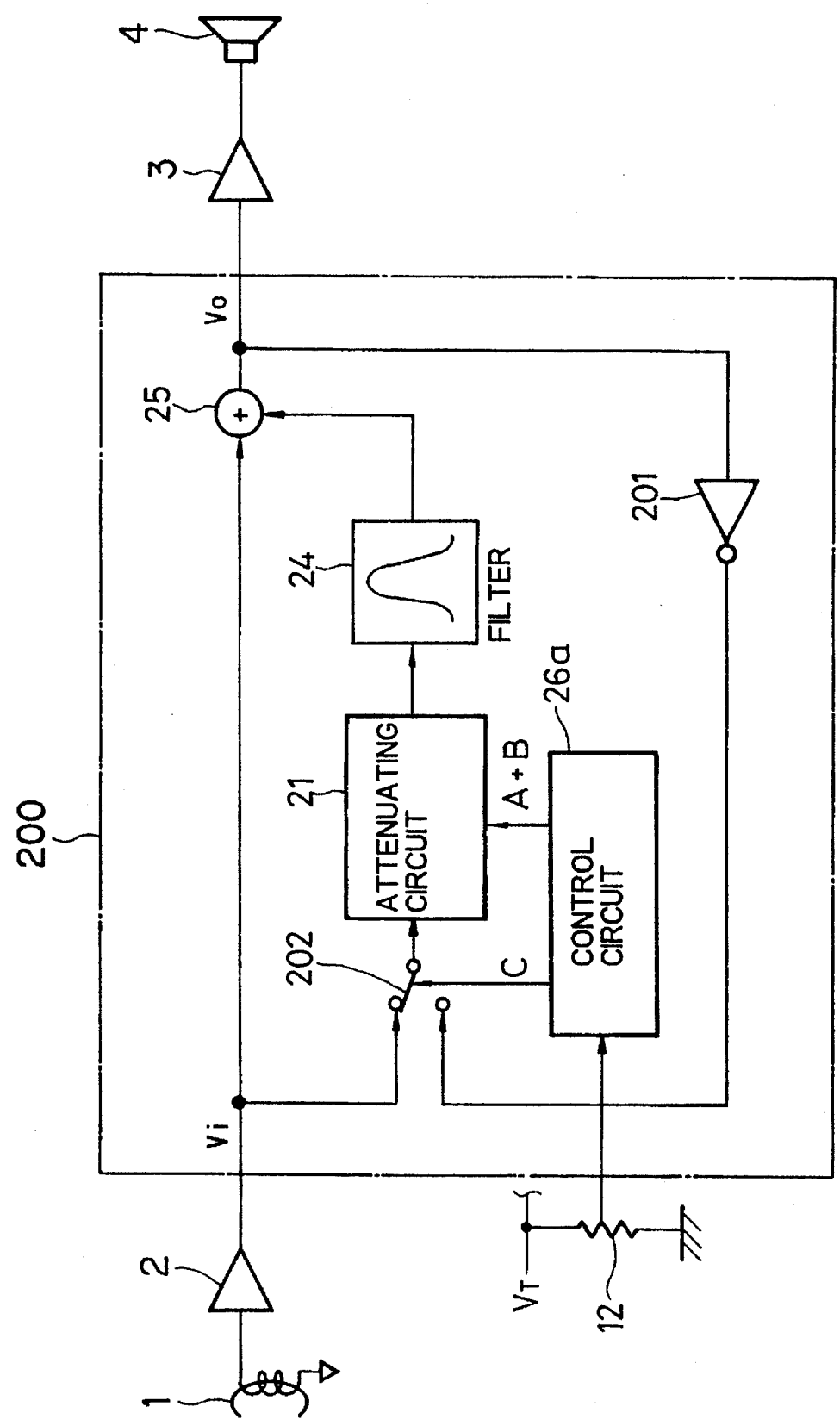
FIG. 3 is a block diagram of another embodiment of cassette type tape players including an equalizer according to the present invention.

FIG. 3 shows another embodiment of the equalizers according to the present invention. In contrast to FIG. 1 equalizer 20 which is constituted by the two attenuating circuits, an equalizer 200 according to the present embodiment uses a single attenuating circuit 21 illustrated in FIG. 1. For this reason, in the present embodiment a phase inverting circuit 201 and a switching circuit 202 are provided. The audio signal Vo is inverted by the phase inverting circuit 201 and outputted to the switching circuit 202. The switching circuit 202 receives a control signal C from the control circuit 26a and switches the input either to the output from the phase inverting circuit 201 or to the audio signal Vi.

When the setting position of the variable resistor 12 is at the emphasizing position, the control circuit 26a generates the control signal C through which the switching circuit 202 is switched to the input from the side of the audio signal Vi to input the output to the attenuating circuit 21. On the other hand, when the setting position of the variable resistor 12 is at the attenuating position, the control signal C from the control circuit 26a is halted or inverted, thereby according to such signal the output of the phase inverting circuit 201 is selected as the input. At this moment, the inverted audio signal Vo effected by the phase inverting circuit 201 is inputted to the attenuating circuit 21. In both instances the output from the attenuating circuit 21 is sent out to the adder circuit 25 via the filter 24 to thereby be added to the audio signal Vi.

The control circuit 26a in the present embodiment is a modified circuit of the control circuit 26 and includes a first circuit which generates the control signal C and a second circuit which outputs a logical OR of the control signals A and B to the attenuating circuit 21.

In the above embodiments, the control signals A and B are explained respectively to be current signals, however the control signals can be of course voltage signals.

Further, the attenuating circuit 21 for a sound quality emphasis among the attenuating circuits 21 and 22 can be provided with a function of amplifying the input signal in addition to the attenuating function.

I claim:

1. An equalizer which receives an audio signal as an input signal, produces a signal having a predetermined frequency band among the input signal and adds or subtracts the produced signal having said predetermined frequency band to and from the audio signal so as to generate an audio signal adjusted either into an attenuated sound quality or an emphasized sound quality comprising:

a first attenuating circuit which receives the input signal and a first control signal and attenuates the input signal depending on the level of the first control signal;

a filter having the predetermined frequency band which receives the output from said first attenuating circuit;

an adding circuit which receives the output from said filter and the input signal so as to add the both and outputs the adjusted audio signal;

a second attenuating circuit which receives either the adjusted audio signal from said adding circuit or a signal corresponding thereto and a second control signal, attenuates either the adjusted audio signal or the signal corresponding thereto depending on the level of the second control signal and sends out a phase inverted signal of the attenuated signal to said filter; and, a control circuit which receives a sound quality adjusting signal and when the sound quality adjusting signal represents a sound quality emphasis, generates the first control signal having a level corresponding to an emphasis condition and when the sound quality adjusting signal represents a sound quality attenuation, generates the second control signal having a level corresponding to an attenuation condition.

2. An equalizer according to claim 1, wherein when the sound quality adjusting signal represents a sound quality non-adjusting condition, the first and second control signals are set at a level which interrupts the operation of said first and second attenuating circuits.

3. An equalizer according to claim 2, wherein said first and second attenuating circuits comprise respective current sources, the first and second control signals are respectively current signals and current values of said respective current sources increase depending on an increase of current values of the respective current signals so as to decrease the respective output current values of said first and second attenuating circuits.

4. An equalizer according to claim 3, wherein said first and second attenuating circuits are constituted by respective voltage/current converting circuits for an attenuating operation having said current source and an adder circuit is provided between said first and second attenuating circuits and said filter.

5. An equalizer according to claim 4, wherein the sound quality adjusting signal is taken out from a movable terminal of a variable resistor, said voltage/current converting circuit is constituted by a voltage/current converting circuit unit and an attenuating circuit unit and further said attenuating circuit unit is provided with said current source.

6. An equalizer which receives an audio signal as an input signal, produces a signal having a predetermined frequency band among the input signal and adds or subtracts the produced signal having said predetermined frequency band to and from the audio signal so as to generate an audio signal adjusted either into an attenuated sound quality or an emphasized sound quality comprising;

a plurality of first attenuating circuits which receive the input signal and a first control signal and attenuate the input signal depending on the level of the first control signal;

a plurality of filters provided for said respective first attenuating circuits and having respective predetermined frequency bands which receive the outputs from said respective first attenuating circuits;

an adding circuit which receives the outputs from said respective filters and the input signal so as to add the both and outputs the adjusted audio signal;

a plurality of second attenuating circuits provided for said respective first attenuating circuits and which receive either the adjusted audio signal from said adding circuit or signal corresponding thereto and a second control signal, attenuate either the adjusted audio signal or the signal corresponding thereto depending on the level of the second control signal and send out phase inverted signals of the attenuated signals to said respective filters;

a control circuit which receives sound quality adjusting signals corresponding to said respective filters and when any of the sound quality adjusting signals represent a sound quality emphasis, sends out the first control signals having levels corresponding to the emphasis conditions to said first attenuating circuits of said concerned filters corresponding to said any of sound quality adjusting signals, and when any of the sound quality adjusting signals represent a sound quality attenuation, sends out the second control signals having levels corresponding to the attenuation conditions to said second attenuating circuits of said concerned filters corresponding to said any of sound quality adjusting signals.

7. An equalizer according to claim 6, wherein when any of a plurality of the second quality adjusting signals represent a sound quality non-adjusting condition, the first and second control signals are set at a level which interrupts the operation of said first and second attenuating circuits of the concerned sound quality adjusting signal.

8. An audio device which receives an audio signal as an input signal, produces a signal having a predetermined frequency band among the input signal and adds or subtracts the produced signal having said predetermined frequency band to and from the audio signal so as to generate an audio signal adjusted either into an attenuated sound quality or an emphasized sound quality comprising:

a first attenuating circuit which receives the input signal and a first control signal and attenuates the input signal depending on the level of the first control signal;

a filter having the predetermined frequency band which receives the output from said first attenuating circuit;

an adding circuit which receives the output from said filter and the input signal so as to add the both and outputs the adjusted audio signal;

a second attenuating circuit which receives either said adjusted audio signal from the adding circuit or a signal corresponding thereto and a second control signal, attenuates either the adjusted audio signal or the signal corresponding thereto depending on the level of the second control signal and sends out a phase inverted signal of the attenuated signal to said filter;

a variable resistor which generates a sound quality adjusting signal at a movable terminal thereof;

a control circuit which receives the sound quality adjusting signal and when the sound quality adjusting signal represents a sound quality emphasis, generates the first control signal having a level corresponding to an emphasis condition and when the sound quality adjusting signal represents a sound quality attenuation, generates the second control signal having a level corresponding to the attenuation condition.

9. An audio device according to claim 8, wherein when the sound quality adjusting signal represents a sound quality non-adjusting condition, the first and second control signals are set at a level which interrupts the operation of said first and second attenuating circuits.

* * * * *